United States Patent
Katsurada et al.

(10) Patent No.: US 10,474,031 B2
(45) Date of Patent: Nov. 12, 2019

(54) PHOTOSENSITIVE RESIN COMPOSITION, PHOTOSENSITIVE RESIN COMPOSITION FILM, CURED PRODUCT, INSULATING FILM AND MULTILAYER WIRING BOARD

(71) Applicant: Toray Industries, Inc., Tokyo (JP)

(72) Inventors: Yuki Katsurada, Otsu (JP); Koichi Aoki, Otsu (JP); Hideki Shinohara, Otsu (JP)

(73) Assignee: Toray Industries, Inc., Tokyo (JP)

( * ) Notice: Subject to any disclaimer, the term of this patent is extended or adjusted under 35 U.S.C. 154(b) by 6 days.

(21) Appl. No.: 15/559,714

(22) PCT Filed: Mar. 15, 2016

(86) PCT No.: PCT/JP2016/058167
§ 371 (c)(1),
(2) Date: Sep. 19, 2017

(87) PCT Pub. No.: WO2016/158389
PCT Pub. Date: Oct. 6, 2016

(65) Prior Publication Data
US 2018/0052391 A1    Feb. 22, 2018

(30) Foreign Application Priority Data

Mar. 27, 2015 (JP) ................................. 2015-066006

(51) Int. Cl.
*G03F 7/037* (2006.01)
*G03F 7/004* (2006.01)
*H05K 3/46* (2006.01)
*C08G 73/10* (2006.01)

(52) U.S. Cl.
CPC ......... *G03F 7/037* (2013.01); *C08G 73/1025* (2013.01); *G03F 7/004* (2013.01); *H05K 3/46* (2013.01)

(58) Field of Classification Search
CPC .................................. G03F 7/037; G03F 7/004
USPC .................................... 430/281.1, 288.1, 906
See application file for complete search history.

(56) References Cited

U.S. PATENT DOCUMENTS

| | | | | |
|---|---|---|---|---|
| 7,282,323 | B2 * | 10/2007 | Kanatani | G03F 7/035 430/18 |
| 7,476,476 | B2 * | 1/2009 | Suwa | C08G 73/101 430/14 |
| 7,563,557 | B2 * | 7/2009 | Kimura | C08G 73/14 430/270.1 |
| 2013/0260109 | A1 * | 10/2013 | Akiyama | G03F 7/029 428/195.1 |

FOREIGN PATENT DOCUMENTS

| | | |
|---|---|---|
| JP | 4-195043 | 7/1992 |
| JP | 2006-251562 | 9/2006 |
| JP | 2008-260839 | 10/2008 |
| JP | 2011-17897 | 1/2011 |
| JP | 2012-141387 | 7/2012 |
| JP | 2013-200328 | 10/2013 |
| JP | 2014-122948 | 7/2014 |
| WO | 2007/026520 A1 | 3/2007 |

* cited by examiner

*Primary Examiner* — John S Chu
(74) *Attorney, Agent, or Firm* — DLA Piper LLP (US)

(57) ABSTRACT

A photosensitive resin composition contains (a) a polyimide which has, at a terminal of the main chain, at least one group selected from the group consisting of a carboxyl group, a phenolic hydroxyl group, a sulfonic acid group and a thiol group, (b) a monomer, (c) a thermally crosslinkable compound, (d) a photopolymerization initiator and (e) a polymerization inhibitor, wherein the polymerization inhibitor (e) is a compound obtained by adding at least one hydroxyl group, alkoxy group, aryloxy group or aralkyloxy group to a naphthalene skeleton or an anthracene skeleton of a compound having a naphthalene skeleton or an anthracene skeleton.

16 Claims, No Drawings

PHOTOSENSITIVE RESIN COMPOSITION, PHOTOSENSITIVE RESIN COMPOSITION FILM, CURED PRODUCT, INSULATING FILM AND MULTILAYER WIRING BOARD

TECHNICAL FIELD

This disclosure relates to a photosensitive resin composition, a photosensitive resin composition film composed thereof, a cured product formed by heat-curing the photosensitive resin composition, an insulating film formed by heat-curing the photosensitive resin composition film, and a multilayer wiring board having the insulating film as an interlayer insulating film. More specifically, this disclosure relates to a photosensitive resin composition suitable for forming a permanent resist that is used as an insulating material even after pattern processing, a photosensitive resin composition film composed thereof, a cured product formed by heat-curing the photosensitive resin composition, an insulating film formed by heat-curing the photosensitive resin composition film, and a multilayer wiring board having the insulating film as an interlayer insulating film.

BACKGROUND

Polyimides have excellent electrical and mechanical characteristics and a high heat resistance of 300° C. or more and, hence, are regarded as useful for applications as surface protection films for semiconductor devices, interlayer insulating films, wiring protection insulating films for circuit boards. In addition, because resist materials are used for circuit formation for semiconductor integrated circuits and multilayer printed wiring boards, the processes therefor are complicated and varied, ranging over film formation on substrates, exposure on predetermined sites, removal of unnecessary sites by etching, cleaning operations for substrate surfaces, and the like. In this regard, photosensitive resin compositions have recently been used more often as permanent resists for applications in which they are kept remaining as insulating materials even after pattern-forming in order to cut down on processes.

Hitherto, many examples of polyimide-containing photosensitive resin compositions have been reported. Proposed among these is a polyimide-containing photosensitive resin composition that contains an already ring-closed polyimide which is not accompanied by the cure shrinkage of film following a ring closure reaction from a polyimide precursor to a polyimide and that can form a high resolution pattern and a film having an excellent heat resistance (for example, see JP 2011-17897 A).

When a polyimide-containing photosensitive resin composition is used as an insulating film, it is important to form a pattern whose cross-sectional shape is rectangular. This is because a pattern having a reverse tapered cross-sectional shape will cause a defective conduction resulting from the insufficient embedding of a metal working as a conductor, and a forward tapered shape will cause the pattern to be formed on the substrate surface more than necessary.

However, when a material such as aforementioned is used for pattern processing, the light exposure margin is narrow, and it is difficult to obtain a pattern having a rectangular cross-sectional shape.

It could therefore be helpful to provide a photosensitive resin composition that can form a pattern having a high resolution, wide light exposure margin, and rectangular cross-sectional shape and can form a film having an excellent heat resistance.

SUMMARY

We thus provide:

A photosensitive resin composition including: (a) a polyimide which has, at a main-chain terminal thereof, at least one group selected from the group consisting of a carboxyl group, a phenolic hydroxyl group, a sulfonic group, and a thiol group; (b) a monomer; (c) a thermally cross-linkable compound; (d) a photopolymerization initiator; and (e) a polymerization inhibitor; wherein the polymerization inhibitor (e) is a compound having a naphthalene skeleton or an anthracene skeleton, containing at least one hydroxyl group, alkoxy group, aryloxy group, and/or aralkyloxy group attached to the naphthalene skeleton or the anthracene skeleton.

A photosensitive resin composition that can stably afford a pattern having a wide light exposure margin, high resolution, and rectangular cross-sectional shape, and which can form an insulating film having an excellent heat resistance after being heat-cured can be obtained. An insulating film obtained from the photosensitive resin composition has excellent electrical characteristics, mechanical characteristics, and heat resistance, and hence is useful for applications as surface protection films for semiconductor devices, interlayer insulating films, and wiring protection insulating films for circuit boards.

DETAILED DESCRIPTION

The photosensitive resin composition includes: (a) a polyimide which has, at a main-chain terminal thereof, at least one group selected from the group consisting of a carboxyl group, a phenolic hydroxyl group, a sulfonic group, and a thiol group; (b) a monomer; (c) a thermally cross-linkable compound; (d) a photopolymerization initiator; and (e) a polymerization inhibitor; wherein the polymerization inhibitor (e) is a compound having a naphthalene skeleton or an anthracene skeleton, containing at least one hydroxyl group, alkoxy group, aryloxy group, and/or aralkyloxy group attached to the naphthalene skeleton or the anthracene skeleton.

This photosensitive resin composition can form a negative pattern that is easily dissolved in an alkali developing solution before light exposure, but is insoluble in an alkali developing solution after light exposure. In addition, this photosensitive resin composition contains a polyimide that is already ring-closed so that, compared to a resin composition containing a polyimide precursor, it is not necessary to convert a polyimide precursor to a polyimide through a ring closure reaction by heating or with a suitable catalyst. On that account, this photosensitive resin composition does not require any high temperature treatment and experiences a smaller amount of stress caused by the cure shrinkage due to an imide ring closure reaction and, hence, can form a thick film more easily than a resin composition containing a polyimide precursor. Further, the polyimide has a capped terminal, hence, having a smaller number of repeating units in the polymer, and results in having a more favorable processability for micropatterning, compared with those having a larger number of repeating units.

The polyimide of the component (a) has, at a main-chain terminal thereof, at least one group selected from the group consisting of a carboxyl group, a phenolic hydroxyl group, a sulfonic group, and a thiol group. This polyimide has these alkali soluble groups present at a main-chain terminal thereof, hence, having alkali solubility. The alkali solubility as mentioned herein means that a solubility into a 2.38% tetramethylammonium aqueous solution is 0.1 g/100 ml or more. Among the aforementioned alkali soluble groups, those having a phenolic hydroxyl group or a thiol group are preferable, considering the practicability with an alkali developing solution used in the semiconductor industry. An alkali soluble group can be introduced at a main-chain terminal with a terminal-capping agent containing an alkali soluble group. Examples of such polyimides preferably include, but are not particularly limited to, one or more kinds of polyimide represented by either general formulae (1) or (2):

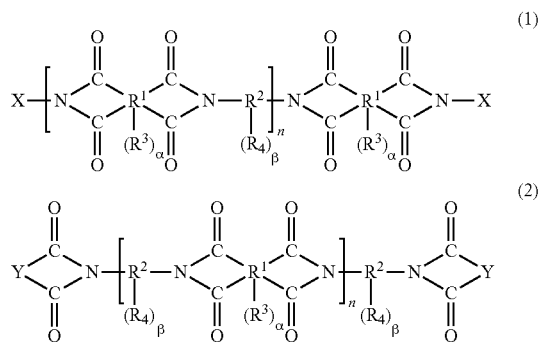

wherein X represents a monovalent organic group having at least one group selected from the group consisting of a carboxyl group, a phenolic hydroxyl group, a sulfonic group, and a thiol group; Y represents a bivalent organic group having at least one group selected from the group consisting of a carboxyl group, a phenolic hydroxyl group, a sulfonic group, and a thiol group; X and Y, among others, are preferably organic groups having a phenolic hydroxyl group or a thiol group;

$R^1$ represents a 4- to 14-valent organic group; $R^2$ represents a 2- to 12-valent organic group; $R^3$ and $R^4$ each independently represent at least one group selected from the group consisting of a carboxyl group, a phenolic hydroxyl group, a sulfonic group, and a thiol group; α and β each independently represent an integer of 0 to 10;

n represents the repeating number of structural units of the polymer; and n is in the range of 3 to 200, preferably 5 to 100. When n is in the range of 3 to 200, the photosensitive resin composition can be used as a thick film and is provided with a sufficient solubility into an alkali developing solution, thereby allowing pattern processing.

In the aforementioned general formulae (1) and (2), $R^1$ represents a structural component derived from tetracarboxylic dianhydride. Among others, $R^1$ is preferably a $C_5$-$C_{40}$ organic group containing an aromatic group or a cyclic aliphatic group.

Specific examples of tetracarboxylic dianhydrides can include: aromatic tetracarboxylic dianhydrides such as pyromellitic dianhydride, 3,3',4,4'-biphenyl tetracarboxylic dianhydride, 2,3,3',4'-biphenyl tetracarboxylic dianhydride, 2,2',3,3'-biphenyl tetracarboxylic dianhydride, 3,3',4,4'-benzophenone tetracarboxylic dianhydride, 2,2',3,3'-benzophenone tetracarboxylic dianhydride, 2,2-bis (3,4-dicarboxyphenyl)propane dianhydride, 2,2-bis(2,3-dicarboxyphenyl) propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl) ether dianhydride, 1,2,5,6-naphthalene tetracarboxylic dianhydride, 9,9-bis(3,4-dicarboxyphenyl)fluorensic acid dianhydride, 9,9-bis {4-(3,4-dicarboxyphenoxy) phenyl}fluorensic acid dianhydride, 2,3,6,7-naphthalene tetracarboxylic dianhydride, 2,3,5,6-pyridine tetracarboxylic dianhydride, 3,4,9,10-perylene tetracarboxylic dianhydride, and 2,2-bis(3,4-dicarboxyphenyl)hexafluoropropane dianhydride; aliphatic tetracarboxylic dianhydrides such as butane tetracarboxylic dianhydride, 1,2,3,4-cyclopentane tetracarboxylic dianhydride; acid dianhydrides having a structure shown below and the like. These are used singly or in combination of two or more kinds thereof.

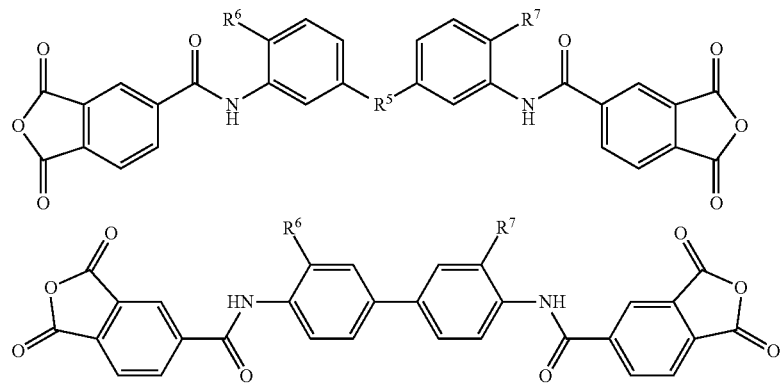

wherein $R^5$ represents a group selected from an oxygen atom, $C(CF_3)_2$, $C(CH_3)_2$, and $SO_2$, and $R^6$ and $R^7$ each represent a group selected from a hydroxyl group and a thiol group.

In general formulae (1) and (2), $R^2$ represents a structural component derived from diamine and is a 2- to 12-valent organic group. Among others, $R^1$ is preferably a $C_5$-$C_{40}$ organic group containing an aromatic group or a cyclic aliphatic group.

Specific examples of diamines include 3,3'-diaminodiphenyl ether, 3,4'-diaminodiphenyl ether, 4,4'-diaminodiphenyl ether, 3,3'-diaminodiphenyl methane, 3,4'-diaminodiphenyl methane, 4,4'-diaminodiphenyl methane, 3,3'-diaminodiphenyl sulfone, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy)benzene, 1,3-bis(4-aminophenoxy)benzene, 1,3-bis(3-aminophenoxy)benzene, benzidine, m-phenylene diamine, p-phenylene diamine, 1,5-naphthalene diamine, 2,6-naphthalene diamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, or compounds in which these aromatic rings have an alkyl group or a halogen atom as a substituent; aliphatic cyclohexyl diamine and methylene biscyclohexyl amine; diamines having a structure shown below and the like. These are used singly or in combination of two or more kinds thereof.

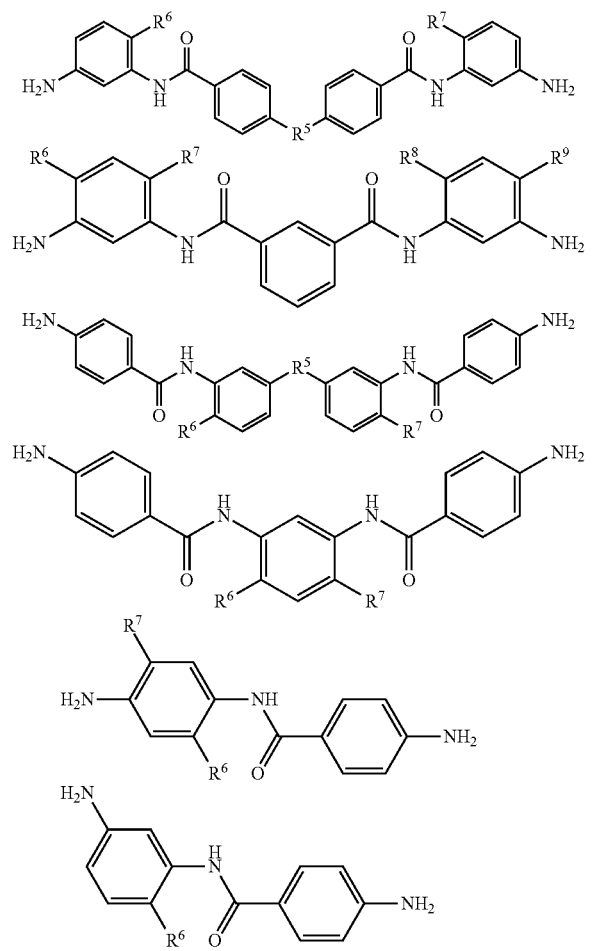

wherein $R^5$ represents a group selected from an oxygen atom, $C(CF_3)_2$, $C(CH_3)_2$, and $SO_2$, and $R^6$ to $R^9$ each represent a group selected from a hydroxyl group and a thiol group.

Preferable among these are 3,3'-diaminodiphenyl ether, 3,4'-diaminodiphenyl ether, 4,4'-diaminodiphenyl ether, 3,3'-diaminodiphenyl methane, 3,4'-diaminodiphenyl methane, 4,4'-diaminodiphenyl methane, 3,3'-diaminodiphenyl sulfone, 3,4'-diaminodiphenyl sulfone, 4,4'-diaminodiphenyl sulfone, 3,4'-diaminodiphenyl sulfide, 4,4'-diaminodiphenyl sulfide, m-phenylene diamine, p-phenylene diamine, 1,4-bis(4-aminophenoxy)benzene, 9,9-bis(4-aminophenyl)fluorene; diamines having a structure shown below and the like.

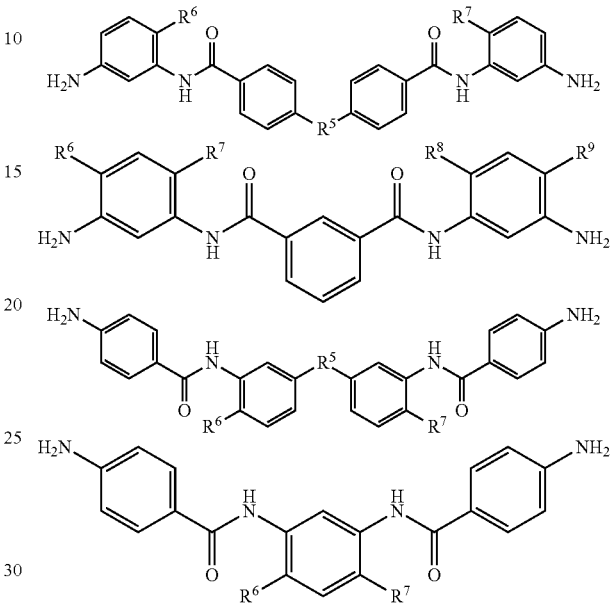

wherein $R^5$ represents a group selected from an oxygen atom, $C(CF_3)_2$, $C(CH_3)_2$, and $SO_2$, and $R^6$ to $R^9$ each represent a group selected from a hydroxyl group and a thiol group.

In general formulae (1) and (2), $R^3$ and $R^4$ each independently represent at least one group selected from the group consisting of a carboxyl group, a phenolic hydroxyl group, a sulfonic group, and a thiol group. Because adjusting the amount of alkali soluble groups of these $R^3$ and $R^4$ changes the rate of dissolution of the polyimide into an alkali aqueous solution, a negative photosensitive resin composition having a suitable rate of dissolution can be obtained.

Further, to enhance the adhesiveness to a substrate, $R^2$ may be copolymerized with an aliphatic group having a siloxane structure, to the extent of not lowering heat resistance. Specific examples include those copolymerized with 1 to 10 mol % diamine component such as bis(3-aminopropyl)tetramethyl disiloxane or bis(p-amino-phenyl)octamethyl pentasiloxane.

In general formula (1), X is derived from a primary monoamine which is a terminal-capping agent. Preferable examples of primary monoamines used as terminal-capping agents include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol and the like. These are used singly or in combination of two or more kinds thereof.

In addition, in general formula (2), Y is derived from a dicarboxylic anhydride which is a terminal-capping agent. Preferable examples of acid anhydrides used as terminal-capping agents include 4-carboxyphthalic anhydride, 3-hydroxyphthalic anhydride, cis-aconitic anhydride and the like. These are used singly or in combination of two or more kinds thereof.

The polyimide of the component (a) may be one composed of only a structural unit represented by general formulae (1) or (2) and may be a copolymer or mixture thereof with another structural unit. In this regard, 30% by mass or more of the structural unit represented by general formulae (1) or (2) is preferably contained relative to the mass of the whole polyimide. More preferably, it is 60% by mass or more. The 30% by mass or more can inhibit shrinkage during heat-curing, and hence is preferred for thick film production. The type and amount of a structural unit used for copolymerization or mixing are preferably selected to the extent of not impairing the heat resistance of the polyimide obtained from the final heating treatment.

The polyimide of the component (a) can be synthesized by utilizing a known method in which part of diamine is substituted with monoamine which is a terminal-capping agent, or tetracarboxylic dianhydride is substituted with dicarboxylic anhydride which is a terminal-capping agent. For example, polyimide precursors are obtained by utilizing a method such as: a method in which to react a tetracarboxylic dianhydride, a diamine compound, and a monoamine at low temperature; a method in which to react a tetracarboxylic dianhydride, a dicarboxylic anhydride, and a diamine compound at low temperature; and a method in which a diester is obtained from a tetracarboxylic dianhydride and alcohol and then reacted in the presence of a diamine, a monoamine, and a condensing agent. Then, polyimides can be synthesized utilizing a method of completely imidizating the obtained polyimide precursors using a known imidization reaction method.

In addition, the imidization ratio of the polyimide of the component (a) is easily obtained by, for example, the following method. The imidization ratio means what mol % of the polyimide precursors has been converted to polyimides in synthesizing polyimides through polyimide precursors as aforementioned. First, a polymer is measured for infrared absorption spectrum, and is checked for absorption peaks of an imide structure which are attributable to a polyimide (at approximately 1780 cm$^{-1}$ and at approximately 1377 cm$^{-1}$). Then, the polymer is heat-treated at 350° C. for one hour, and again measured for infrared absorption spectrum, followed by comparison between the peak intensities at approximately 1377 cm$^{-1}$ which are measured before heat treatment and after heat treatment. The imidization ratio of the polymer before heat treatment is determined relative to the imidization ratio of the polymer after heat treatment as 100%. The imidization ratio of the polymer is preferably 90% or more.

The terminal-capping agent introduced into the polyimide of the component (a) can be detected by the following method. For example, a polyimide into which a terminal-capping agent is introduced is dissolved in an acidic solution, decomposed into constituent units of the polyimide, i.e., an amine component and a carboxylic anhydride component, which are measured by gas chromatography (GC) or NMR. Apart from this, a polyimide into which a terminal-capping agent is introduced can also be measured directly using a pyrolysis gas chromatograph (PGC), infrared spectrum, and $^{13}$CNMR spectrum for the detection.

The photosensitive resin composition contains a monomer (b). Examples of polymerizable groups of the monomer (b) include: unsaturated double bond functional groups such as vinyl groups, allyl groups, acryloyl groups, and methacryloyl groups; and/or unsaturated triple bond functional groups such as propargyl groups, and among these, conjugate type vinyl groups, acryloyl groups, and methacryloyl groups are preferable in view of polymerizability. In addition, in that cracks will occur to a pattern when cross-linking points arising from polymerization reaction are many, the number of functional groups contained is preferably 1 to 6, and respective ones do not have to be the same group.

Examples of the monomer (b) include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylol propane diacrylate, trimethylolpropane triacrylate, trimethylolpropane dimethacrylate, trimethylolpropane trimethacrylate, styrene, α-methylstyrene, 1,2-dihydronaphthalene, 1,3-diisopropenyl benzene, 3-methylstyrene, 4-methylstyrene, 2-vinylnaphthalene, butyl acrylate, butyl methacrylate, isobutyl acrylate, hexyl acrylate, isooctyl acrylate, isobornyl acrylate, isobornyl methacrylate, cyclohexyl methacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol dimethacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, 2-hydroxyethyl acrylate, 2-hydroxyethyl methacrylate, 1,3-diacryloyloxy-2-hydroxypropane, 1,3-dimethacryloyloxy-2-hydroxypropane, methylene bisacrylamide, N,N-dimethyl acrylamide, N-methylol acrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, propylene oxide-modified bisphenol A diacrylate, propylene oxide-modified bisphenol A methacrylate, propoxylated ethoxylated bisphenol A diacrylate, propoxylated ethoxylated bisphenol A dimethacrylate, N-vinyl pyrrolidone, N-vinyl caprolactam, and the like. These are used singly or in combination of two or more kinds thereof.

Particularly preferable examples among these include 1,9-nonanediol dimethacrylate, 1,10-decanediol dimethacrylate, dimethylol-tricyclodecane diacrylate, isobornyl acrylate, isobornyl methacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, methylene bisacrylamide, N,N-dimethyl acrylamide, N-methylol acrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, propylene oxide-modified bisphenol A diacrylate, propylene oxide-modified bisphenol A methacrylate, propoxylated ethoxylated bisphenol A diacrylate, propoxylated ethoxylated bisphenol A dimethacrylate, N-vinyl pyrrolidone, N-vinyl caprolactam, and the like.

The content of the monomer (b) in the photosensitive resin composition is preferably 40 parts by mass or more of the monomer (b) mass, more preferably 50 parts by mass or more, relative to 100 parts by mass of the polyimide (a) mass, in view of affording sufficient film remaining after development. In addition, it is preferably 150 parts by mass or less of the monomer (b) mass, more preferably 100 parts by mass or less, relative to 100 parts by mass of the polyimide (a) mass, in view of enhancing the heat resistance of the cured film.

The photosensitive resin composition contains a thermally cross-linkable compound (c). Containing the thermally cross-linkable compound (c) causes a thermal cross-linking reaction during heat treatment, hence enhancing the heat resistance of the cured film. Examples of the thermally cross-linkable compound (c) include: compounds having a thermally cross-linkable group represented by the structure shown below; and benzooxazine compounds.

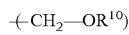

wherein $R^{10}$ represents a hydrogen atom, a $C_1$-$C_{20}$ alkyl group, a $C_4$-$C_{20}$ alicyclic hydrocarbon group, or an $R^{11}$ CO group. In addition, $R^{11}$ represents a $C_1$-$C_{20}$ alkyl group.

As compounds having a thermally cross-linkable group, those containing at least two thermally cross-linkable groups are preferable. Particularly preferable examples include: as those having two thermally cross-linkable groups, 46DMOC and 46DMOEP (trade name, made by Asahi Yukizai Corporation), DML-MBPC, DML-MBOC, DML-OCHP, DML-PC, DML-PCHP, DML-PTBP, DML-34X, DML-EP, DML-POP, Dimethylol-BisOC-P, DML-PFP, DML-PSBP, DML-MTrisPC, and DMOM-PTBP (trade name, made by Honshu Chemical Industry Co., Ltd.), "NIKALAC" ® MX-290 (trade name, made by Sanwa Chemical Co., Ltd.), B-a Type Benzooxazine and B-m Type Benzooxazine (trade name, made by Shikoku Chemicals Corporation), 2,6-dimethoxymethyl-4-t-butyl phenol, 2,6-dimethoxymethyl-p-cresol, 2,6-diacetoxymethyl-p-cresol and the like; as those having three, TriML-P and TriML-35XL (trade name, made by Honshu Chemical Industry Co., Ltd.) and the like; as those having four, TM-BIP-A (trade name, made by Asahi Yukizai Corporation), TML-BP, TML-HQ, TML-pp-BPF, TML-BPA, and TMOM-BP (trade name, made by Honshu Chemical Industry Co., Ltd.), NIKALAC MX-280 and NIKALAC MX-270 (trade name, made by Sanwa Chemical Co., Ltd.) and the like; as those having six, HML-TPPHBA, HML-TPHAP, HMOM-TPPHBA, and HMOM-TPHAP (trade name, made by Honshu Chemical Industry Co., Ltd.) and the like.

The structures of the particularly preferable typical thermally cross-linkable compounds are shown below.

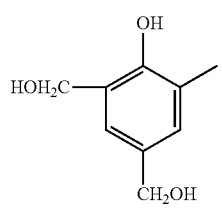

46DMOC

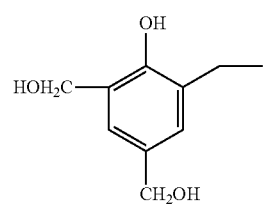

46DMOEP

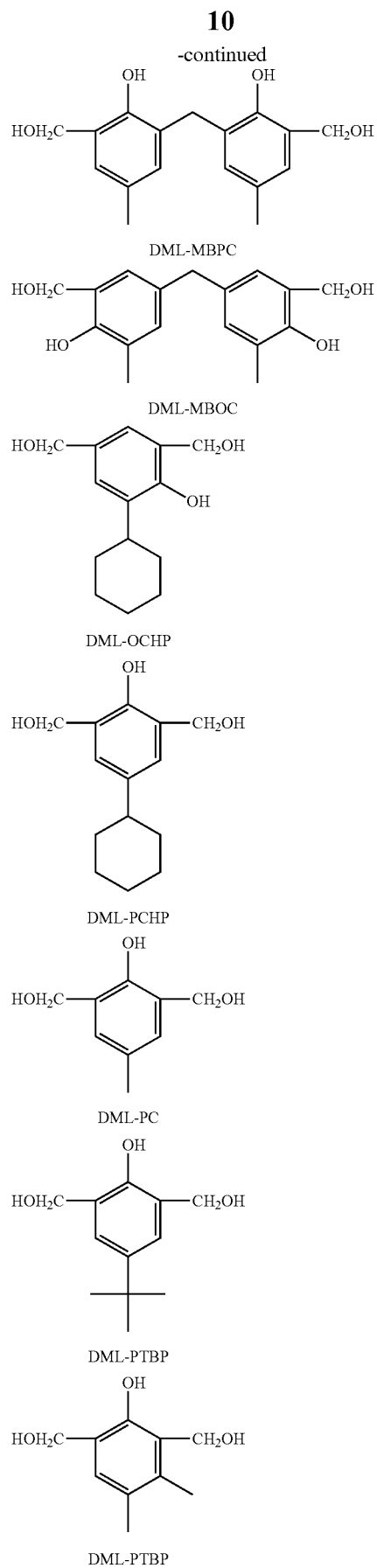

-continued
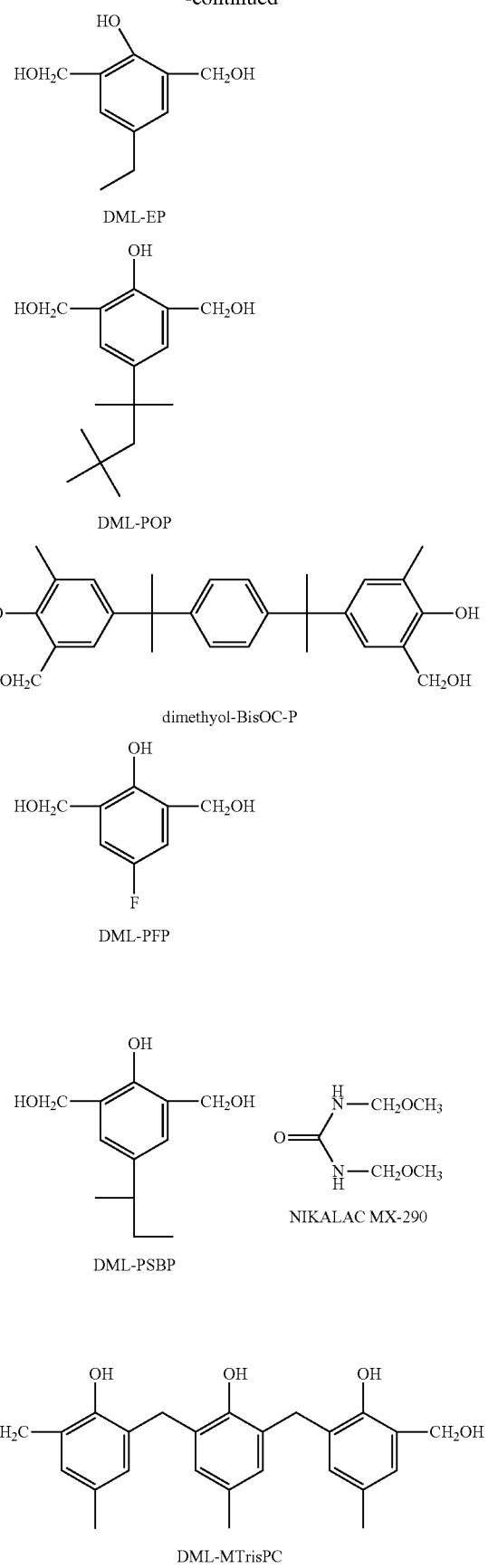
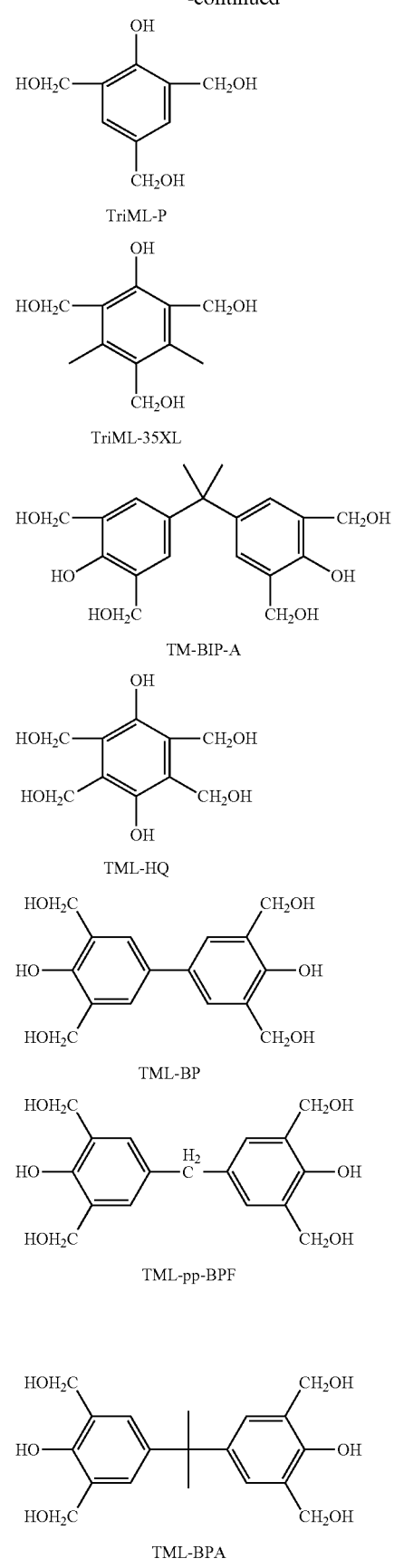

-continued
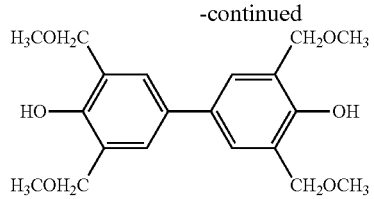
TMOM-BP
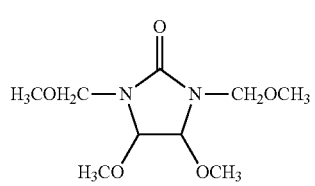
NIKALAC MX-280
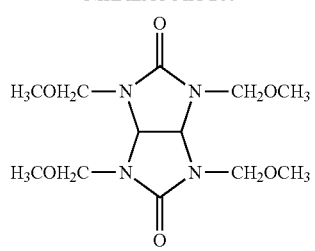
NIKALAC MX-270
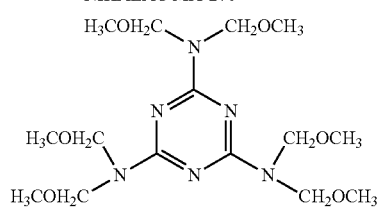
NIKALAC MW-100LM
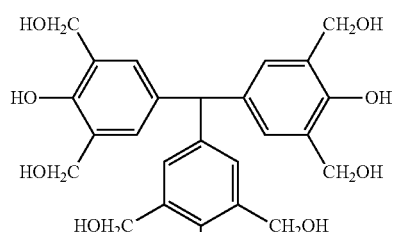
HML-TPPHBA
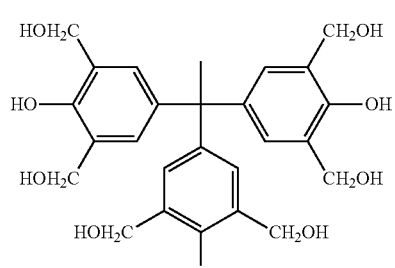
HML-TPHAP
-continued
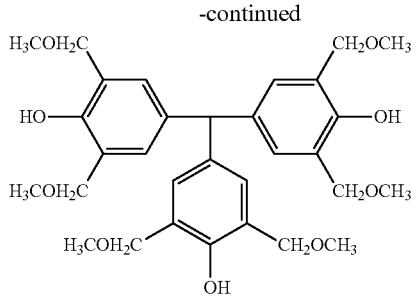
HMOM-TPPHBA
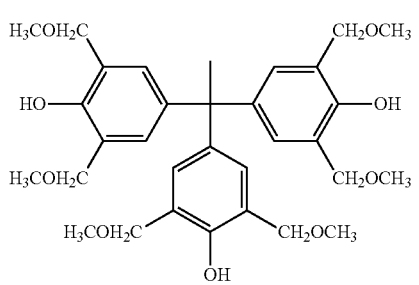
HMOM-TPHAP
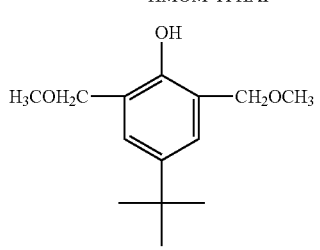
2,6-dimethoxymethyl-4-t-butylphenol
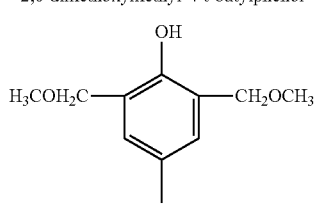
2,6-dimethoxymethyl-p-cresol
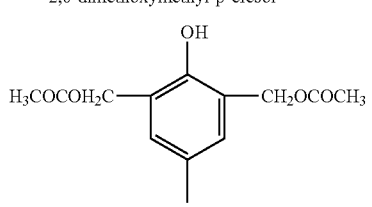
2,6-diacetoxymethyl-p-cresol
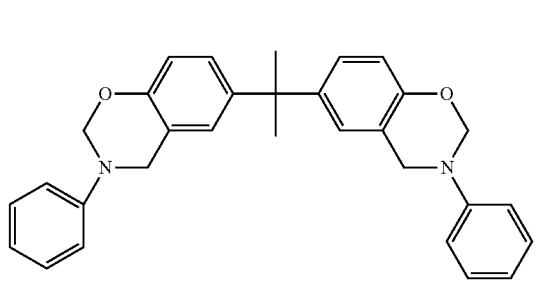
B-a type benzoxazine

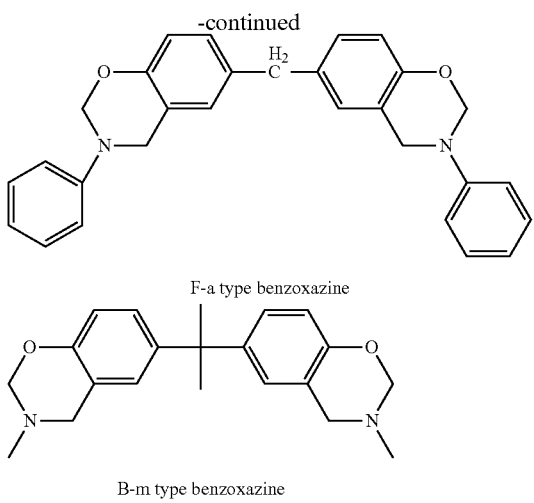

F-a type benzoxazine

B-m type benzoxazine

The content of such a thermally cross-linkable compound (c) is preferably 1 part by mass or more of the thermally cross-linkable compound (c) mass, more preferably 5 parts by mass or more, relative to 100 parts by mass of the polyimide (a) mass, in view of enhancing the heat resistance of the cured film. In addition, the thermally cross-linkable compound (c) mass is preferably 70 parts by mass or less, more preferably 50 parts by mass or less, relative to 100 parts by mass of the polyimide (a) mass, in view of the ratio of film remaining after development.

The content of such a thermally cross-linkable compound (c) is preferably 0.5 parts by mass or more of the thermally cross-linkable compound (c) mass, more preferably 3 parts by mass or more, relative to 100 parts by mass of the total mass of the polyimide (a) and the monomer (b), in view of enhancing the heat resistance of the cured film. In addition, the thermally cross-linkable compound (c) mass is preferably 50 parts by mass or less, more preferably 30 parts by mass or less, relative to 100 parts by mass of the total mass of the polyimide (a) and the monomer (b), in view of the ratio of film remaining after development.

The photosensitive resin composition contains a photopolymerization initiator (d). Examples of the photopolymerization initiator (d) include: benzophenones such as benzophenone, Michler's ketone, 4,4,-bis(diethylamino)benzophenone, and 3,3,4,4,-tetra(t-butylperoxycarbonyl)benzophenone; benzylidenes such as 3,5-bis(diethylaminobenzylidene)-N-methyl-4-piperidone and 3,5-bis(diethylaminobenzylidene)-N-ethyl-4-piperidone; coumarins such as 7-diethylamino-3-nonylcoumarin, 4,6-dimethyl-3-ethylaminocoumarin, 3,3-carbonyl bis(7-diethylaminocoumarin), and 7-diethylamino-3-(1-methylmethylbenzimidazolyl)coumarin, 3-(2-benzothiazolyl)-7-diethylaminocoumarin; anthraquinones such as 2-t-butylanthraquinone, 2-ethylanthraquinone, and 1,2-benzanthraquinone; benzoins such as benzoin methyl ether, benzoin ethyl ether, and benzoin isopropyl ether; thioxanthones such as 2,4-dimethylthioxanthone, 2,4-diethylthioxanthone, 2,4-diisopropylthioxanthone, and 2-isopropylthioxanthone; mercaptos such as ethylene glycol di(3-mercapto propionate), 2-mercapto benzthiazole, 2-mercapto benzoxazole, and 2-mercapto benzimidazole; glycines such as N-phenylglycine, N-methyl-N-phenylglycine, N-ethyl-N-(p-chloro phenyl)glycine, and N-(4-cyanophenyl)glycine; oximes such as 1-phenyl-1,2-butanedione-2-(o-methoxy carbonyl)oxime, 1-phenyl-1,2-propanedione-2-(o-methoxy carbonyl)oxime, 1-phenyl-1,2-propanedione-2-(o-ethoxycarbonyl)oxime, 1-phenyl-1,2-propanedione-2-(o-benzoyl) oxime, bis(α-isonitrosopropiophenonoxime)isophthal, 1,2-octanedione-1-[4-(phenylthio)phenyl]-2-(o-benzoyl oxime), ethanone, 1-[9-ethyl-6-(2-methyl benzoyl)-9H-carbazole-3-yl]-,1-(o-acetyloxime); benzyldimethyl ketals such as 2,2-dimethoxy-1,2-diphenylethane-1-one; α-hydroxyalkylphenons such as 1-hydroxycyclohexylphenyl ketone, 2-hydroxy-2-methyl-1-phenyl-propane-1-one, 1-[4-(2-hydroxy ethoxy)-phenyl]-2-hydroxy-2-methyl-1-propane-1-one, and 2-hydroxy-1-{4-[4-(2-hydroxy-2-methyl-propionyl)-benzyl]phenyl}-2-methyl-propane-1-one; α-aminoalkylphenons such as 2-benzyl-2-dimethylamino-1-(4-morpholinophenyl)-butane-1-one, 2-methyl-1-[4-(methylthio)phenyl]-2-morpholinopropane-1-one, and 2-(dimethyl amino)-2-[(4-methylphenyl)methyl]-1-[4-(4-morpholinyl)phenyl]-1-butanone; acylphosphine oxides such as 2,4,6-trimethylbenzoyldiphenyl-phosphine oxide, and bis(2,4,6-trimethylbenzoyl)-phenylphosphine oxide; 2,2'-bis(o-chlorophenyl)-4,4',5,5'-tetraphenyl biimidazole; and the like.

Among these, combinations of compounds selected from the aforementioned benzophenones, glycines, mercaptos, oximes, benzyldimethylketals, α-hydroxyalkylphenons, α-aminoalkylphenons, acylphosphine oxides, and 2,2'-bis(o-chlorophenyl)-4,4',5,5'-tetraphenylbiimidazole are preferred in view of photoreaction. These photopolymerization initiators are used singly or in combination of two or more kinds thereof. Oximes and acylphosphine oxides are more preferable, and particularly preferable are compounds selected from 1-phenyl-1,2-propanedione-2-(o-ethoxycarbonyl)oxime, 1-phenyl-1,2-propanedione-2-(o-benzoyl)oxime, bis(α-isonitrosopropiophenonoxime)isophthal, IRGACURE OXE01, IRGACURE OXE02, DAROCUR TPO, IRGACURE 819 (trade name, made by Ciba Specialty Chemicals Co., Ltd.), N-1919 and NCI-831 (trade name, made by ADEKA Corporation).

The content of the photopolymerization initiator (d) is preferably 0.1 parts by mass or more of the photopolymerization initiator (d) mass, more preferably 1 part by mass or more, relative to 100 parts by mass of the polyimide (a) mass. In addition, the photopolymerization initiator (d) mass is preferably 40 parts by mass or less, more preferably 20 parts by mass or less, relative to 100 parts by mass of the polyimide (a) mass. When two or more kinds of photopolymerization initiators are used in combination, the total amount thereof is in the aforementioned range. When the photopolymerization initiator (d) mass is 0.1 parts by mass or more relative to 100 parts by mass of the polyimide (a) mass, the polymerization reaction of the polymerizable compound progresses sufficiently during light exposure. In addition, when the photopolymerization initiator (d) mass is 40 parts by mass or less relative to the polyimide (a) mass, it can allow even a thick film to retain a sufficient light transmittance and to form a pattern. In addition, the most preferable amount of this content is selected as appropriate in accordance with the type of photopolymerization initiator to be selected.

In addition, the content of the photopolymerization initiator (d) is preferably 0.05 parts by mass or more of the photopolymerization initiator (d) mass, more preferably 0.5 parts by mass or more, relative to 100 parts by mass of the total mass of the polyimide (a) and the monomer (b). In addition, the photopolymerization initiator (d) mass is preferably 30 parts by mass or less, more preferably 15 parts by mass or less, relative to 100 parts by mass of the total mass of the polyimide (a) and the monomer (b). When two or more kinds of photopolymerization initiators are used in combination, the total amount thereof is in the aforementioned range. When the photopolymerization initiator (d) mass is 0.05 parts by mass or more relative to 100 parts by mass of the total mass of the polyimide (a) and the monomer (b), the polymerization reaction of the polymerizable compound progresses sufficiently during light exposure. In addition, when the photopolymerization initiator (d) mass is 30 parts by mass or less relative to 100 parts by mass of the total mass of the polyimide (a) and the monomer (b), it can allow even a thick film to retain a sufficient light transmittance and to form a pattern. In addition, the most preferable amount of this content is selected as appropriate in accordance with the type of photopolymerization initiator to be selected.

On the other hand, because the mass ratio of the photopolymerization initiator (d) and the monomer (b) affects the pattern processability, the photopolymerization initiator (d) mass is preferably 0.1 parts by mass or more, more preferably 1 part by mass, further preferably 5 parts by mass or more, relative to 100 parts by mass of the monomer (b) mass. In addition, the photopolymerization initiator (d) mass is preferably 70 parts by mass or less, more preferably 30 parts by mass or less, further preferably 15 parts by mass or less, relative to 100 parts by mass of the monomer (b) mass. The photopolymerization initiator (d) mass being 0.1 parts by mass or more relative to 100 parts by mass of the monomer (b) mass causes the polymerization reaction to progress sufficiently and facilitates pattern-formation. On the other hand, the 70 parts by mass or less causes the excited photopolymerization initiator (d) to be in a suitable concentration range and suppresses deactivation between the excitons, hence, making it easier to control a pattern.

The photosensitive resin composition contains a polymerization inhibitor (e). Containing the polymerization inhibitor (e) regulates the concentration of excitons, hence, enabling the formation of a pattern having a rectangular cross-sectional shape. In addition, the polymerization inhibitor (e) allows excessive photoresponsivity to be suppressed and allows a light exposure margin to be widened.

The polymerization inhibitor (e) is a compound having a naphthalene skeleton or an anthracene skeleton, containing at least one hydroxyl group, alkoxy group, aryloxy group, and/or aralkyloxy group attached to the naphthalene skeleton or the anthracene skeleton, which compound is one whose radical is delocalized so that the radical substance is stable, and having a high polymerization inhibition effect. Preferable among others is a compound having a naphthalene skeleton or an anthracene skeleton, containing at least one hydroxyl group attached to the naphthalene skeleton or the anthracene skeleton, and more preferable is a compound having a naphthalene skeleton, containing at least one hydroxyl group attached to the naphthalene skeleton.

Examples of the polymerization inhibitor (e) include 1-naphthol, 1,4-dihydroxnaphthalene, 4-methoxy-1-naphthol, 1-methonaphthalene, 1,4-dimethoxynaphthalene, 2,6-dimethoxynaphthalene, 2,7-dimethoxynaphthalene, 1,4-diethoxynaphthalene, 2,6-diethoxynaphthalene, 2,7-diethoxynaphthalene, 2,6-dibutoxynaphthalene, 2-ethyl-1,4-diethoxynaphthalene, 1,4-dibutoxynaphthalene, 1,4-diphenethyloxynaphthalene, 9-butoxyanthracene, 9,10-butoxyanthracene, 1,8,9-trihydroxyanthracene and the like. These polymerization inhibitors (e) are used singly or in combination of two or more kinds thereof. A compound having a naphthalene skeleton is more preferable, and 4-methoxy-1-naphthol is particularly preferable.

The content of the polymerization inhibitor (e) is preferably 0.01 parts by mass or more of the polymerization inhibitor (e) mass, more preferably 0.1 parts by mass or more, relative to 100 parts by mass of the polyimide (a) mass. In addition, the polymerization inhibitor (e) mass is preferably 15 parts by mass or less, more preferably 10 parts by mass or less, relative to 100 parts by mass of the polyimide (a) mass. When two or more kinds of polymerization inhibitors are used in combination, the total amount thereof is in the aforementioned range. When the polymerization inhibitor (e) mass is 0.01 parts by mass or more relative to 100 parts by mass of the polyimide (a) mass, polymerization is more sufficiently controlled, a pattern having a rectangular cross-sectional shape is more easily obtained, and a light exposure margin is more widened. In addition, when the polymerization inhibitor (e) mass is 15 parts by mass or less relative to 100 parts by mass of the polyimide (a) mass, polymerization progresses more sufficiently, and pattern-forming is facilitated.

In addition, the content of the polymerization inhibitor (e) is preferably 0.005 parts by mass or more of the polymerization inhibitor (e) mass, more preferably 0.03 parts by mass or more, further preferably 0.1 parts by mass or more, relative to 100 parts by mass of the total mass of the polyimide (a) and the monomer (b). In addition, the polymerization inhibitor (e) mass is preferably 10 parts by mass or less, more preferably 5 parts by mass or less, further preferably 3 parts by mass or less, relative to 100 parts by mass of the total mass of the polyimide (a) and the monomer (b). When two or more kinds of polymerization inhibitors are used in combination, the total amount thereof is in the aforementioned range. When the polymerization inhibitor (e) mass is 0.005 parts by mass or more relative to 100 parts by mass of the total mass of the polyimide (a) and the monomer (b), polymerization is more sufficiently controlled, a pattern having a rectangular cross-sectional shape is more easily obtained, and a light exposure margin is more widened. In addition, when the polymerization inhibitor (e) mass is 10 parts by mass or less relative to 100 parts by mass of the total mass of the polyimide (a) and the monomer (b), polymerization progresses more sufficiently, and pattern-forming is facilitated.

In addition, because the mass ratio of the polymerization inhibitor (e) and the photopolymerization initiator (d) affects the pattern processability, the polymerization inhibitor (e) mass is preferably 0.1 parts by mass or more, more preferably 0.5 parts by mass or more, further preferably 1 part by mass or more, relative to 100 parts by mass of the photopolymerization initiator (d) mass. In addition, it is preferably 100 parts by mass or less, more preferably 70 parts by mass or less, further preferably 40 parts by mass or less, relative to 100 parts by mass of the photopolymerization initiator (d) mass. The polymerization inhibitor (e) mass being 0.1 parts by mass or more relative to 100 parts by mass of the photopolymerization initiator (d) causes polymerization to be more sufficiently controlled, makes it easier to obtain a pattern having a rectangular cross-sectional shape, and results in widening a light exposure margin. In addition, when the polymerization inhibitor (e) mass is 100 parts by mass or less, polymerization progresses more sufficiently and pattern-forming is facilitated.

In addition to the aforementioned polymerization inhibitor having a condensed polycyclic aromatic skeleton, a generally used polymerization inhibitor such as a phenol-based or benzoquinone-based one may be added.

In addition, the photosensitive resin composition can further contain a coloring agent. Containing a coloring agent affords the effect of preventing stray light from light emitting areas when used for an insulating layer of an organic electric field light emitting device and the concealing effect of concealing the circuit wiring on a substrate when used for a solder resist for circuit boards. Examples of coloring agents include dye, heat coloring dye, inorganic pigment, organic pigment, and the like. In addition, coloring agents that are soluble in an organic solvent which dissolves the component (a) and that are compatible with the component (a) are preferable.

Further, to enhance adhesiveness between the photosensitive resin composition and a substrate, the composition may contain a surfactant, if necessary.

In addition, to enhance adhesiveness to a ground substrate such as a silicon wafer, a silane coupling agent, a titanium chelate agent and the like can be added to the photosensitive resin composition.

Further, the photosensitive resin composition can also contain additives such as a cross-linking agent, a cross-linking promoter, a sensitizing agent, a solubility adjusting agent, a stabilizer, and an antifoaming agent, if necessary, and the total amount of the polyimide (a), the monomer (b), the thermally cross-linkable compound (c), the photopolymerization initiator (d), and the polymerization inhibitor (e) in the whole solid is preferably 80% by mass or more, more preferably 90% by mass or more.

The photosensitive resin composition is obtained by mixing and dissolving the polyimide (a), the monomer (b), the thermally cross-linkable compound (c), the photopolymerization initiator (d), the polymerization inhibitor (e), and other additives.

In addition, the photosensitive resin composition can be dissolved in an organic solvent to make a solution having about 20 to 70% by mass of solid, if necessary. The organic solvent used here has only to be one which dissolves the photosensitive resin composition, and may be a solvent mixture in which two types or more of organic solvents are mixed.

Specific examples of organic solvents include: ethers such as ethylene glycol monomethyl ether, ethylene glycol monoethyl ether, propylene glycol monomethyl ether, propylene glycol monoethyl ether, ethylene glycol dimethyl ether, ethylene glycol diethyl ether, and ethylene glycol dibutyl ether; acetates such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, and butyl lactate; ketones such as acetone, methyl ethyl ketone, acetyl acetone, methyl propyl ketone, methyl butyl ketone, methyl isobutyl ketone, cyclopentanone, and 2-heptanone; alcohols such as butyl alcohol, isobutyl alcohol, pentanol, 4-methyl-2-pentanol, 3-methyl-2-butanol, 3-methyl-3-methoxy butanol, and diacetone alcohol; aromatic hydrocarbons such as toluene and xylene; others such as N-methyl-2-pyrrolidone, N-cyclohexyl-2-pyrrolidone, N,N-dimethyl formamide, N,N-dimethyl acetamido, dimethyl sulfoxide, and γ-butyrolactone and the like.

The cured product is one formed by heat-curing the photosensitive resin composition. As a heat-curing condition, the performance thereof at a temperature of 120° C. to 400° C. is preferable. In addition, the form of the cured product is not limited to a particular one but can be selected from a film-like, a rod-like, and a spherical form in accordance with the application, and is preferably film-like in particular. The films as mentioned here include films, sheets, plates, pellets and the like.

The photosensitive resin composition film is characterized by being composed of the photosensitive resin composition. A method of producing the photosensitive resin composition film will be described. The photosensitive resin composition film is obtained by applying the photosensitive resin composition on a support and then drying it, if necessary.

In addition, the photosensitive resin composition may be filtered using a paper filter or another type of filter. The filtering method is not limited to a particular one, but is preferably a method of filtering under pressure using a filter with a retaining particle size of 0.4 μm to 10 μm.

The photosensitive resin composition film is formed on a support. A support used for this is not limited to a particular one, but various films that are usually commercially available such as polyethylene terephthalate (PET) films, polyphenylene sulfide films, and polyimide films can be used. A surface treatment such as with silicone, a silane coupling agent, an aluminum chelate agent, or polyurea may be provided to enhance the adhesiveness and releasability of a joined face between the support and the photosensitive resin composition film. In addition, the thickness of the support is not limited to a particular value, but is preferably 10 to 100 μm in view of workability.

In addition, the photosensitive resin composition film may have a protection film on the film to protect the photosensitive resin composition film. Because of this, the photosensitive resin composition film surface can be protected from pollutants such as dirt and dust in the atmosphere.

Examples of protection films include polyethylene films, polypropylene (PP) films, polyester films, and polyvinyl alcohol films. The protection film is preferably such that the protection film is not easily released from the photosensitive resin composition film.

Examples of methods for coating the support with the photosensitive resin composition include methods such as spin-coating using a spinner, spray coating, roll coating, screen printing, blade coaters, die coaters, calender coaters, meniscus coaters, bar coaters, roll coaters, comma roll coaters, gravure coaters, screen coaters, and slit die coaters. In addition, the coated film thickness depends on the coating technique, the concentration of solid in the composition, the viscosity and the like, but usually the film thickness achieved after drying is preferably 0.5 μm to 100 μm.

For drying, an oven, a hot plates, infrared ray and the like can be used. The drying temperature and the drying time have only to be in a range in which an organic solvent can be volatilized, and is preferably set, as appropriate, in a range such that the photosensitive resin composition film turns into the uncured or half-cured state. Specifically, it is preferably carried out at 40° C. to 120° C. for one to tens of minutes. In addition, these temperatures may be combined and raised in a stepwise manner, and, for example, heat treatment may be carried out at 50° C., 60° C., and 70° C., each for one minute.

The insulating film is one formed by heat-curing the photosensitive resin composition film. As a heat-curing condition, the performance thereof at a temperature of 120° C. to 400° C. is preferable.

Next, a method of pattern-processing the photosensitive resin composition film to form a permanent resist will be exemplified.

First, a method for using the photosensitive resin composition film to form a photosensitive resin composition coating on a substrate will be described. If the photosensitive resin composition film has a protection film, the latter is released, and the photosensitive resin composition film and a substrate are adhered together by thermo compression bonding such that they face each other. Thermo compression bonding can be carried out by thermal pressing, thermal laminating, thermal vacuum laminating, and the like. The thermo compression bonding temperature is preferably 40° C. or more in view of adhesiveness and embeddability to a substrate. In addition, the thermo compression bonding temperature is preferably 150° C. or less to prevent the photosensitive film from being cured during thermo compression bonding and thereby deteriorating the resolution of pattern-forming in the processes of light exposure and development.

Examples of substrates include silicon wafers, ceramics, gallium arsenic, organic circuit boards, inorganic circuit boards, and these substrates with constituent materials for circuits arranged thereon, but are not limited thereto. Examples of organic circuit boards include: glass-substrate copper-clad laminate sheets such as glass fabric/epoxy copper-clad laminate sheets; composite copper-clad laminate sheets such as glass nonwoven fabric/epoxy copper-clad laminate sheets; heat-resistant/thermoplastic substrates such as polyether imide resin substrates, polyether ketone resin substrates, and polysulfone resin substrates; flexible substrates such as polyester copper-clad films substrates, and polyimide copper-clad film substrates and the like. In addition, examples of inorganic circuit boards include: ceramic substrates such as alumina substrates, aluminum nitride substrates, and silicon carbide substrates; and metallic substrates such as aluminum-based substrates and iron-based substrates. Examples of constituent materials for circuits include: conductors containing metals such as silver, gold, and copper; resistance elements containing inorganic oxides and the like; low dielectric materials containing glass-based materials and/or resins and the like; high dielectric materials containing resins, high dielectric constant inorganic particles and the like; insulating materials containing glass-based materials and the like.

Next, the photosensitive resin composition coating formed by the aforementioned method is irradiated with actinic rays through a mask having a desired pattern and is exposed to light. Examples of actinic rays used for light exposure include ultraviolet rays, visible rays, electron rays, X-rays and the like, and i-rays (365 nm), h-rays (405 nm), and g-rays (436 nm) of a mercury-vapor lamp are preferably used. When a support in the photosensitive resin composition film is a material transparent to these rays, light exposure may be carried out without releasing the support from the photosensitive resin composition film.

To form a pattern, unexposed parts are removed using a developing solution after light exposure. As developing solutions, preferable are: a tetramethylammonium aqueous solution; and aqueous solutions of compounds exhibiting alkalinity such as diethanolamine, diethylaminoethanol, sodium hydroxide, potassium hydroxide, sodium carbonate, potassium carbonate, triethylamine, diethyl amine, methylamine, dimethylamine, dimethylaminoethyl acetate, dimethylaminoethanol, dimethylaminoethyl methacrylate, cyclohexylamine, ethylene diamine, and hexamethylene diamine. In some cases, these alkali aqueous solutions may contain one kind of or a combination of two or more kinds of: polar solvents such as N-methyl-2-pyrrolidone, N,N-dimethyl formamide, N,N-dimethyl acetamido, dimethyl sulfoxide, γ-butyrolactone, and dimethyl acrylamide; alcohols such as methanol, ethanol, and isopropanol; esters such as ethyl lactate and propylene glycol monomethyl ether acetate; and ketones such as cyclopentanone, cyclohexanone, isobutyl ketone, methyl isobutyl ketone and the like.

Development can be carried out by a method such that a coating surface is sprayed with the aforementioned developing solution, immersed in the developing solution, ultrasonicated while being immersed, or sprayed with the developing solution while the substrate is being rotated. Conditions for development such as a developing time and a developing solution temperature in a developing step have only to be conditions under which unexposured parts are removed, and it is preferable that, even after unexposured parts are removed, development be further carried out for micropatterning and for removing residues between patterns.

After development, rinse treatment may be carried out with water. The rinse treatment may be carried out with water to which alcohols such as ethanol and isopropyl alcohol, esters such as ethyl lactate and propylene glycol monomethyl ether acetate or the like are added.

A process of baking treatment may be introduced before development, if the permissible ranges of developing conditions are widened, such as if a pattern resolution is enhanced during development. The temperatures for this are preferably 50 to 180° C., more preferably 60 to 120° C. in particular. The time is preferably 5 seconds to several hours.

After development, a temperature of 120° C. to 400° C. is applied to make a cured film. This heating treatment is carried out for 5 minutes to 5 hours while raising temperature through selected temperatures in a stepwise manner or while raising temperature continuously in a selected temperature range. By way of an example, heat treatment is carried out at 130° C. and 200° C., each for 30 minutes. Alternatively, another example is a method such that temperature is raised linearly from room temperature to 250° C. in 2 hours. For this, the heating temperature is preferably 150° C. to 300° C., more preferably 180° C. to 250° C. In addition, it is important that a cured film obtained by heating treatment have an excellent heat resistance. The heat resistance as mentioned here means a temperature which is reached in measuring thermogravity with a thermogravimetry device and at which the weight has been reduced by 5% relative to the weight at the measurement start, and the heat resistance of a cured film is preferably 300° C. or more, more preferably 330° C. or more, further preferably 350° C. or more.

The form of the cured product is not limited to a particular one, but can be selected from a film-like, a rod-like, and a spherical form in accordance with the application, and is preferably film-like in particular. The films as mentioned here include films, sheets, plates, pellets and the like. Needless to say, pattern-forming can be carried out in accordance with the applications such as forming via holes for conduction, adjusting impedance, capacitance, or internal stress, imparting a heat radiation function and the like.

The film thickness of a cured film can be set to any value, and is preferably 0.5 μm to 100 μm.

The photosensitive resin composition film and a cured film obtained therefrom are not limited to a particular application and can be applied to, for example: surface protection films built in substrates and packages for systems using semiconductors, such as mounted substrates and wafer level packages; interlayer insulating films; resists such as wiring protection insulating films for circuit boards; and various electronic components and devices. In addition, in view of the excellent heat resistance, they are favorably used particularly as permanent resists, in other words, interlayer insulating films formed into patterns. Further, they can be favorably used for adhesives applications by thermo-compression-bonding a pattern-formed substrate, glass, semiconductor device, or the like to an adherend.

The multilayer wiring board has the insulating film as an interlayer insulating film. A method of producing a multilayer wiring board using the photosensitive resin composition or photosensitive resin composition film will be exemplified.

First, a first circuit layer is formed on an insulating substrate or an insulating layer, and, as the forming method, a known method such as a panel plating process, a subtractive process, an additive process and the like can be used. For this, the photosensitive resin composition or photosensitive resin composition film may be used so that an insulating film having a via hole layer can be produced on an insulating substrate or an insulating layer, and a known damascene process may be used to form a wiring layer which is a first circuit layer. Next, a second circuit layer is formed on the wiring layer. For this, in the same manner as with the aforementioned first layer, the photosensitive resin composition or photosensitive resin composition film may be used so that an insulating film having a via hole layer can be produced on the aforementioned wiring layer, and a known damascene process may be used to form a wiring layer which is a second circuit layer. After this, a desired multilayer wiring board can be produced by carrying out the number of cycles corresponding to the number of necessary wiring layers.

The photosensitive resin composition and photosensitive resin composition film and a cured product and insulating film obtained therefrom are not limited to a particular application and can be applied to, for example: surface protection films built in substrates and packages for systems using semiconductors, such as mounted substrates and wafer level packages; interlayer insulating films; resists such as wiring protection insulating films for circuit boards; and various electronic components and devices. In addition, in view of the excellent heat resistance, they are favorably used particularly as permanent resists, in other words, interlayer insulating films formed into patterns. Further, they can be favorably used for adhesives applications by thermo-compression-bonding a pattern-formed substrate, glass, semiconductor device, or the like to an adherend.

EXAMPLES

Examples and Comparative Examples are shown below and described specifically, but it is needless to say that this disclosure is not to be limited to the Examples.

The polyimide (a) (polyimide A) used in each Example and Comparative Example was synthesized by the following method.

Polyimide A

Under a dry nitrogen stream, 32.96 g (0.09 mol) of 2,2-bis(3-amino-4-hydroxyphenyl)hexafluoropropane and 1.24 g (0.005 mol) of 1,3-bis(3-aminopropyl)tetramethyldisiloxane were dissolved in 100 g of N-methyl-2-pyrrolidone (hereinafter referred to as NMP). To this, 31.02 g (0.10 mol) of bis(3,4-dicarboxyphenyl)ether dianhydride together with 30 g of NMP was added, stirred at 20° C. for one hour, and then stirred at 50° C. for 4 hours. To this, 1.09 g (0.01 mol) of 3-aminophenol was added, stirred at 50° C. for 2 hours, and then stirred at 180° C. for 5 hours to obtain a resin solution. Next, the resin solution was poured into 3 L of water to assemble white precipitate. This precipitate was collected by filtration, washed with water 3 times, and then dried in a vacuum dryer at 80° C. for 5 hours. Resin powder was obtained at an imidization ratio of 94%.

Each of the materials other than the polyimide (a) used in Examples and Comparative Examples is as follows:
(b) Monomer
    BP-6EM (trade name, made by Kyoeisha Chemical Co., Ltd., ethylene oxide-modified bisphenol A dimethacrylate)
    DPE-6A (trade name, made by Kyoeisha Chemical Co., Ltd., dipentaerythritol hexaacrylate)
(c) Thermally Cross-Linkable Compound
    HMOM-TPHAP (trade name, made by Honshu Chemical Industry Co., Ltd.)
(d) Photopolymerization Initiator
    NCI-831 (trade name, made by ADEKA Corporation)
    IRGACURE-819 (trade name, Ciba Specialty Chemicals Co., Ltd., bis(2,4,6-trimethylbenzoyl)-phenylphosphine oxide)
(e) Polymerization Inhibitor
    QS-30 (trade name, made by Kawasaki Kasei Chemicals Ltd., 4-methoxy-1-naphthol)
(e') Other Polymerization Inhibitors
    PTZ (made by Tokyo Chemical Industry Co., Ltd., phenothiazine)
    MEHQ (made by Tokyo Chemical Industry Co., Ltd., 4-methoxy phenol)

Example 1

(a) polyimide A: 35 g, (b) DPE-6A: 2 g, BP-6EM: 18 g, (c) HMOM-TPHAP: 6 g, (d) NCI-831: 1.5 g, and (e) QS-30: 0.015 g were dissolved in a solvent including diacetone alcohol/ethyl lactate at a ratio of 40/60. The amount of solvent added was adjusted such that the additives other than the solvent were solid and such that the concentration of the solid was 45%. Then, the adjusted product was filtered under pressure using a filter with a retaining particle size of 2 μm to obtain a photosensitive resin composition. The obtained photosensitive resin composition was applied to a support film (PET film having a thickness of 50 Lm) using a comma roll coater and dried at 80° C. for 7 minutes, whereafter a PP film having a thickness of 50 μm was laminated as a protection film, and a photosensitive resin composition film having a thickness of 25 μm was obtained.

Examples 2 to 9, Comparative Examples 1 to 3

In the same manner as in Example 1, the photosensitive resin composition films for Examples 2 to 9 and Comparative Examples 1 to 3 were produced at the mixing ratios shown in Table 1.
Evaluations Next, using each of the photosensitive resin composition films obtained in Examples 1 to 9 and Comparative Examples 1 to 3, a pattern was formed on a 4-inch silicon wafer by the following method, and evaluated for resolution, pattern cross-sectional shape, and remaining film ratio, with the evaluation results summarized in Table 1.
Pattern-Forming Method The protection film was released from the produced photosensitive resin composition film, and the released surface was laminated onto a silicon wafer using a laminating device (VTM-200M, made by Takatori Corporation) under the conditions of a stage temperature of 80° C., a roll temperature of 80° C., a degree of vacuum of 150 Pa, an attaching rate of 5 mm/second, and an attaching pressure of 0.3 MPa. Then, a mask having patterns at the L/Ss of 50/50, 45/45, 40/40, 35/35, 30/30, 25/25, and 20/20 μm was set on a light exposure device, and exposed to an L39 filter transmitted beam of an ultra-high pressure mercury-vapor lamp at a light exposure amount of 300 mJ/cm² (h-ray converted) under the conditions such that the mask and the support film are in contact. After light exposure, the mask was heated on a hot plate at 100° C. for 5 minutes. Next, the support film was released, unexposured parts were removed by 80-second shower development using an aqueous solution of 2.38% tetramethylammonium hydroxide, and rinse treatment was carried out with water for 60 seconds. Then, spin drying was carried out, and a pattern obtained.

Evaluation of Resolution

Each patterned substrate obtained by the aforementioned pattern-forming method was observed using a light microscopy (ECLIPSE L300, made by Nikon Corporation) at a magnification ratio of 100×, and the smallest size of pattern lines in which there were no such abnormalities as clogging was used to evaluate the resolution.

Evaluation of Cross-Sectional Shape of Pattern

The silicon wafer was cut perpendicularly to the pattern on each patterned substrate obtained by the aforementioned pattern-forming method, so that the pattern cross-section was exposed. Then, the pattern cross-section of L/S=50/50 was observed using a light microscopy (ECLIPSE L300, made by Nikon Corporation) at a magnification ratio of 1000×, and the pattern cross-sectional shape was evaluated. The width of the top part of the pattern cross-section was compared to that of the bottom part, and when the difference was 0 μm to 0.5 μm, the pattern was rated A; more than 0.5 μm and 1 μm or less, B; more than 1 μm and 3 μm or less, C; more than 3 μm and 5 μm or less, D; and more than 5 μm, E.

Evaluation of Remaining Film Ratio

The remaining film ratio of each pattern obtained by the aforementioned pattern-forming method was calculated by the following equation:

Remaining film ratio (%)=film thickness after pattern-forming/film thickness of photosensitive resin composition film×100

Examples 4-2 to 4-5

The patterns of Examples 4-2 to 4-5 were obtained in the same manner as in Example 4 except that the light exposure amount was 150, 450, 600, and 750 mJ/cm² respectively, in place of 300 mJ/cm², in the Pattern-forming method. The obtained pattern was evaluated by the method described in the Evaluation of cross-sectional shape of pattern. The results are shown in Table 2 together with the results for the cross-sectional shape of the pattern of Example 4.

Examples 9-2 to 9-5

The patterns of Examples 9-2 to 9-5 were obtained in the same manner as in Example 9 except that the light exposure amount was 150, 450, 600, and 750 mJ/cm² respectively, in place of 300 mJ/cm², in the Pattern-forming method. The obtained pattern was evaluated by the method described in the Evaluation of cross-sectional shape of pattern. The results are shown in Table 3 together with the results for the cross-sectional shape of the pattern of Example 9.

Comparative Examples 1-2 to 1-5

The patterns of Comparative Examples 1-2 to 1-5 were obtained in the same manner as in Comparative Example 1 except that the light exposure amount was 150, 450, 600 m, and 750 J/cm² respectively, in place of 300 mJ/cm², in the Pattern-forming method. The obtained pattern was evaluated by the method described in the Evaluation of cross-sectional shape of pattern. The results are shown in Table 4 together with the results for the cross-sectional shape of the pattern of Comparative Example 1.

Comparative Examples 2-2 to 2-5

The patterns of Comparative Examples 2-2 to 2-5 were obtained in the same manner as in Comparative Example 2 except that the light exposure amount was 150, 450, 600 m, and 750 J/cm² respectively, in place of 300 mJ/cm², in the Pattern-forming method. The obtained pattern was evaluated by the method described in the Evaluation of cross-sectional shape of pattern. The results are shown in Table 5 together with the results for the cross-sectional shape of the pattern of Comparative Example 2.

Comparative Examples 3-2 to 3-5

The patterns of Comparative Examples 3-2 to 3-5 were obtained in the same manner as in Comparative Example 3 except that the light exposure amount was 150, 450, 600 m, and 750 J/cm² respectively, in place of 300 mJ/cm², in the Pattern-forming method. The obtained pattern was evaluated by the method described in the Evaluation of cross-sectional shape of pattern. The results are shown in Table 6 together with the results for the cross-sectional shape of the pattern of Comparative Example 3.

TABLE 1

| | | Examples | | | | | | | | | Comparative Examples | | |
|---|---|---|---|---|---|---|---|---|---|---|---|---|---|
| | | 1 | 2 | 3 | 4 | 5 | 6 | 7 | 8 | 9 | 1 | 2 | 3 |
| (a) Polyimide (g) | Polyimide A | 35 | 35 | 35 | 35 | 35 | 35 | 35 | 35 | 35 | 35 | 35 | 35 |
| (b) Monomer (g) | DPE-6A | 2 | 2 | 2 | 2 | 2 | 2 | 2 | 2 | 2 | 2 | 2 | 2 |
| | BP-6EM | 18 | 18 | 18 | 18 | 18 | 18 | 18 | 18 | 18 | 18 | 18 | 18 |
| (c) Thermally cross-linkable compound (g) | HMOM-TPHAP | 6 | 6 | 6 | 6 | 6 | 6 | 6 | 6 | 6 | 6 | 6 | 6 |
| (d) Photopolymerization initiator (g) | NCI-831 | 1.5 | 1.5 | 1.5 | 1.5 | 1.5 | 1.5 | | | | 1.5 | 1.5 | 1.5 |
| | IRGACURE-819 | | | | | | | 3 | 3 | 3 | | | |
| (e) Polymerization inhibitor (g) | QS-30 | 0.015 | 0.075 | 0.15 | 0.225 | 0.45 | 0.75 | 0.15 | 0.75 | 1.5 | | | |
| (e') Other polymerization inhibitors (g) | PTZ | | | | | | | | | | | 0.225 | |
| | MEHQ | | | | | | | | | | | | 0.225 |

TABLE 1-continued

|  | Examples | | | | | | | | | Comparative Examples | | |
| --- | --- | --- | --- | --- | --- | --- | --- | --- | --- | --- | --- | --- |
|  | 1 | 2 | 3 | 4 | 5 | 6 | 7 | 8 | 9 | 1 | 2 | 3 |
| Parts by mass of component (e) relative to 100 parts by mass of the total of component (a) and component (b) | 0.027 | 0.14 | 0.27 | 0.41 | 0.82 | 1.36 | 0.27 | 1.36 | 2.73 | 0 | 0.41 | 0.41 |
| Resolution L/S (μm) | 30/30 | 25/25 | 25/25 | 20/20 | 20/20 | 20/20 | 30/30 | 25/25 | 20/20 | 40/40 | 25/25 | 30/30 |
| Pattern cross-sectional shape | A | A | A | A | A | A | A | A | A | E | B | C |
| Remaining film ratio (%) | 93 | 92 | 92 | 91 | 90 | 90 | 94 | 92 | 91 | 93 | 92 | 92 |

TABLE 2

|  | Example 4-2 | Example 4 | Example 4-3 | Example 4-4 | Example 4-5 |
| --- | --- | --- | --- | --- | --- |
| Amount of light exposure (mJ/cm$^2$) | 150 | 300 | 450 | 600 | 750 |
| Pattern cross-sectional shape | A | A | A | A | A |

TABLE 3

|  | Example 9-2 | Example 9 | Example 9-3 | Example 9-4 | Example 9-5 |
| --- | --- | --- | --- | --- | --- |
| Amount of light exposure (mJ/cm$^2$) | 150 | 300 | 450 | 600 | 750 |
| Pattern cross-sectional shape | A | A | A | A | A |

TABLE 4

|  | Comparative Example 1-2 | Comparative Example 1 | Comparative Example 1-3 | Comparative Example 1-4 | Comparative Example 1-5 |
| --- | --- | --- | --- | --- | --- |
| Amount of light exposure (mJ/cm$^2$) | 150 | 300 | 450 | 600 | 750 |
| Pattern cross-sectional shape | D | E | E | E | E |

TABLE 5

|  | Comparative Example 2-2 | Comparative Example 2 | Comparative Example 2-3 | Comparative Example 2-4 | Comparative Example 2-5 |
| --- | --- | --- | --- | --- | --- |
| Amount of light exposure (mJ/cm$^2$) | 150 | 300 | 450 | 600 | 750 |
| Pattern cross-sectional shape | B | B | C | D | D |

TABLE 6

|  | Comparative Example 3-2 | Comparative Example 3 | Comparative Example 3-3 | Comparative Example 3-4 | Comparative Example 3-5 |
| --- | --- | --- | --- | --- | --- |
| Amount of light exposure (mJ/cm$^2$) | 150 | 300 | 450 | 600 | 750 |
| Pattern cross-sectional shape | C | C | D | E | E |

Comparison Results

As shown in Table 1, regarding resolution and pattern cross-sectional shape, the Examples 1 to 9 each have obtained a favorable resolution and pattern cross-sectional shape. In addition, the remaining film ratios of Examples 1 to 9 were values over 90%, the addition of a polymerization inhibitor showed no significant reduction in the remaining film ratio, and favorable results were shown. Next, as shown in Tables 2 and 3, the pattern cross-sectional shapes of Examples 4, 4-2 to 4-5, 9, 9-2 to 9-5 were favorable even if the amount of light exposure was varied, which has revealed that a wide light exposure margin was obtained.

INDUSTRIAL APPLICABILITY

A photosensitive resin composition that can stably afford a pattern having a wide light exposure margin, high resolution, and rectangular cross-sectional shape, and can form an insulating film having an excellent heat resistance after being heat-cured can be obtained. An insulating film obtained from the photosensitive resin composition has excellent electrical characteristics, mechanical characteristics, and heat resistance and, hence, is useful for applications as surface protection films for semiconductor devices, interlayer insulating films, and wiring protection insulating films for circuit boards.

The invention claimed is:

1. A photosensitive resin composition comprising:
   (a) a polyimide having, at a main-chain terminal thereof, at least one group selected from the group consisting of a carboxyl group, a phenolic hydroxyl group, a sulfonic group, and a thiol group;
   (b) a monomer;
   (c) a thermally cross-linkable compound;
   (d) a photopolymerization initiator; and
   (e) a polymerization inhibitor;
   wherein the polymerization inhibitor (e) is a compound having a naphthalene skeleton or an anthracene skeleton, containing at least a hydroxyl group and an alkoxy group, attached to the naphthalene skeleton or the anthracene skeleton.

2. The photosensitive resin composition according to claim 1, wherein the polyimide (a) comprises a polyimide represented by general formula (1) or general formula (2):

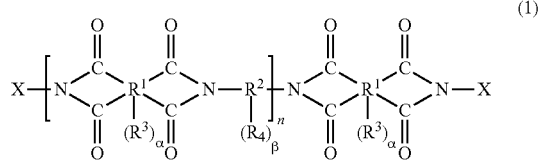

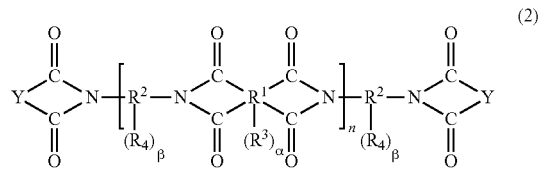

wherein X represents a monovalent organic group having at least one group selected from the group consisting of a carboxyl group, a phenolic hydroxyl group, a sulfonic group, and a thiol group;
Y represents a bivalent organic group having at least one group selected from the group consisting of a carboxyl group, a phenolic hydroxyl group, a sulfonic group, and a thiol group;

$R^1$ represents a 4- to 14-valent organic group;
$R^2$ represents a 2- to 12-valent organic group;
$R^3$ and $R^4$ each independently represent at least one group selected from the group consisting of a carboxyl group, a phenolic hydroxyl group, a sulfonic group, and a thiol group;
α and β each independently represent an integer of 0 to 10; and
n represents an integer of 3 to 200.

3. The photosensitive resin composition according to claim 1, comprising 0.03 to 10 parts by mass of the polymerization inhibitor (e) relative to 100 parts by mass of the total amount of: the polyimide (a) having, at the main-chain terminal thereof, at least one group selected from the group consisting of a carboxyl group, a phenolic hydroxyl group, a sulfonic group, and a thiol group; and the monomer (b).

4. A photosensitive resin composition film, composed of the photosensitive resin composition according to claim 1.

5. A cured product formed by heat-curing the photosensitive resin composition according to claim 1.

6. An insulating film formed by heat-curing the photosensitive resin composition film according to claim 4.

7. A multilayer wiring board comprising the insulating film according to claim 6 as an interlayer insulating film.

8. The photosensitive resin composition according to claim 2, comprising 0.03 to 10 parts by mass of the polymerization inhibitor (e) relative to 100 parts by mass of the total amount of: the polyimide (a) having, at the main-chain terminal thereof, at least one group selected from the group consisting of a carboxyl group, a phenolic hydroxyl group, a sulfonic group, and a thiol group; and the monomer (b).

9. A photosensitive resin composition film, composed of the photosensitive resin composition according to claim 2.

10. A photosensitive resin composition film, composed of the photosensitive resin composition according to claim 3.

11. A cured product formed by heat-curing the photosensitive resin composition according to claim 2.

12. A cured product formed by heat-curing the photosensitive resin composition according to claim 3.

13. An insulating film formed by heat-curing the photosensitive resin composition film according to claim 9.

14. An insulating film formed by heat-curing the photosensitive resin composition film according to claim 10.

15. A multilayer wiring board comprising the insulating film according to claim 13 as an interlayer insulating film.

16. A multilayer wiring board comprising the insulating film according to claim 14 as an interlayer insulating film.

* * * * *